US008071873B2

(12) United States Patent
Rabinowitz (10) Patent No.: US 8,071,873 B2
(45) Date of Patent: *Dec. 6, 2011

(54) SOLAR CONCENTRATOR WITH INDUCED DIPOLE ALIGNMENT OF PIVOTED MIRRORS (76) Inventor: Mario Rabinowitz, Redwood City, CA (US)

(*) Notice: Subject to any disclaimer, the term of this patent is extended or adjusted under 35 U.S.C. 154(b) by 1067 days.

This patent is subject to a terminal disclaimer.

(21) Appl. No.: 11/934,772

(22) Filed: Nov. 3, 2007

(65) Prior Publication Data
US 2010/0326521 A1  Dec. 30, 2010

(51) Int. Cl.
H01L 31/00 (2006.01)
G02B 5/08 (2006.01)

(52) U.S. Cl. ........................ 136/259; 359/849
(58) Field of Classification Search ............ 136/246, 136/259; 359/853, 851, 852, 845, 849; 126/600–608
See application file for complete search history.

(56) References Cited

U.S. PATENT DOCUMENTS

| | | | |
|---|---|---|---|
| 1,386,781 A | 8/1921 | Harvey | |
| 2,563,980 A * | 8/1951 | Wahlberg | 384/536 |
| 2,645,534 A * | 7/1953 | Becker | 384/107 |
| 3,009,391 A | 11/1961 | Zagieboylo et al. | |
| 3,905,352 A | 9/1975 | Jahn | |
| 4,013,885 A * | 3/1977 | Blitz | 250/203.4 |
| 4,159,710 A | 7/1979 | Prast | |
| 4,243,018 A | 1/1981 | Hubbard | |
| 4,385,430 A | 5/1983 | Bartels | |
| 4,784,700 A | 11/1988 | Stern et al. | |
| 4,968,355 A | 11/1990 | Johnson | |
| 6,698,693 B2 | 3/2004 | Rabinowitz | |
| 6,959,993 B2 | 11/2005 | Gross et al. | |
| 6,964,486 B2 | 11/2005 | Rabinowitz | |
| 6,975,445 B1 | 12/2005 | Rabinowitz | |
| 6,987,604 B2 * | 1/2006 | Rabinowitz et al. | 359/296 |
| 6,988,809 B2 | 1/2006 | Rabinowitz | |
| 7,115,881 B2 | 10/2006 | Rabinowitz | |
| 7,130,102 B2 | 10/2006 | Rabinowitz | |
| 7,133,183 B2 | 11/2006 | Rabinowitz | |
| 7,156,088 B2 | 1/2007 | Luconi | |
| 7,187,490 B2 | 3/2007 | Rabinowitz | |
| 7,192,146 B2 | 3/2007 | Gross et al. | |
| 7,568,479 B2 * | 8/2009 | Rabinowitz | 126/600 |

(Continued)

OTHER PUBLICATIONS

Zaky, A. A., et al., "The Direct Breakdown Voltage of Silicone Oil Under Uniform Fields", Apr. 1985, IEEE Transactions on Etrical Insulation vol. EI-20 No. 2, pp. 333-337.*

Primary Examiner — Basia Ridley
Assistant Examiner — Tamir Ayad (57) ABSTRACT

This invention deals with novel method and apparatus for positioning and motion control of the elements (mirrors) of a Fresnel reflector solar concentrator tracking heliostat array by induced and/or permanent dipole coupling to an electronic grid to produce angular deflection, and rotational motion. Thus forces and torques are produced without the use of internal moving parts. Control is achieved without recourse to magnetic fields, by means of high electric fields which may be attained at relatively low voltages. At low voltages, the instant invention exceeds the capability of conventional systems. It can perform dynamic motion control with independent amplitude and frequency modulation. It is ideally suited for maximization of solar energy focused by the array onto a receiver. Since there are no internal moving parts, the instant invention is the most adapted for fabrication from the mini- to the microtechnology realm. Furthermore it provides less costly and greater ease of manufacture from the mini- to the micro-realm.

6 Claims, 5 Drawing Sheets

U.S. PATENT DOCUMENTS

| | | | |
|---|---|---|---|
| 7,736,007 B2 * | 6/2010 | Rabinowitz | 359/853 |
| 7,773,290 B2 * | 8/2010 | Rabinowitz | 359/296 |
| 7,866,836 B2 * | 1/2011 | Rabinowitz | 359/851 |
| 2005/0162763 A1 * | 7/2005 | Rabinowitz | 359/851 |
| 2005/0168850 A1 * | 8/2005 | Rabinowitz et al. | 359/851 |
| 2005/0195465 A1 * | 9/2005 | Rabinowitz | 359/291 |

* cited by examiner

SOLAR CONCENTRATOR WITH INDUCED DIPOLE ALIGNMENT OF PIVOTED MIRRORS

FIELD OF THE INVENTION

The instant invention relates generally to a Solar Energy Concentrator Fresnel reflector array that tracks the sun and focuses the reflected light by means of induced dipole alignment of pivoted mirrors. The mirrors may be on a universal pivot that can rotate or tilt in any direction; or on gimbal pivots.

BACKGROUND OF THE INVENTION

This invention provides a better means to achieve affordable solar energy than by a conventional tracking heliostat array. In the latter, enabling the optical elements (mirrors) to be movable generally requires many large heavy motors that consume a great deal of power. This results in an expensive, bulky, and ponderous heliostat that is unfavorable for rooftop and other applications where much weight cannot be tolerated. The present invention functions in solar concentrators and similar equipment much the same as parabolic dish and parabolic trough concentrators, without their disadvantages of bulk and weight. The angular alignment of the optical elements (mirrors, refractors, lenses, etc.) is accomplished by induced dipole alignment of pivoted mirrors rather than with cumbersome motors. Induced dipole alignment of rotatable mirrors is described and taught in detail in U.S. Pat. No. 6,964,486, "Alignment of Solar Concentrator Micro-Mirrors" by Mario Rabinowitz, issued on Nov. 15, 2005; and U.S. Pat. No. 7,187,490, "Induced Dipole Alignment Of Solar Concentrator Balls" by Mario Rabinowitz, issued on Mar. 6, 2007. As described in these patents, the electric dipole can be induced in the metallic conducting part of the mirror and/or the dielectric part of the mirror.

DESCRIPTION OF THE PRIOR ART

No prior art was found related to induced dipole alignment in electric fields of pivoted mirrors serving as reflecting elements in a Fresnel reflector solar concentrator. The prior art has investigated mirrored ball alignment where the balls are in concentric cavities; and mirrored ball alignment where the balls are between two egg crate like sheets. No prior art was found that utilized induced dipole alignment in electric fields of pivoted mirrors in a Fresnel reflector solar concentrator, optical switches, displays, or other similar equipment. The instant invention can be operated without need of containment by concentric cavities or an egg crate structure. Furthermore, the pivoted structure of the instant invention permits operation without confinement, and if desired operation in air.

INCORPORATION BY REFERENCE

In a solar energy application (as well as other functions), adjustable reflecting elements are an important feature of a Fresnel reflector solar concentrator which tracks the sun and directs the sunlight to a receiver as described in the following patents and published papers. The following U.S. patents, and Solar Journal publication are fully incorporated herein by reference.

1. U.S. Pat. No. 7,247,790 by Mario Rabinowitz, "Spinning Concentrator Enhanced Solar Energy Alternating Current Production" issued on Jul. 24, 2007.
2. U.S. Pat. No. 7,187,490 by Mario Rabinowitz, "Induced Dipole Alignment Of Solar Concentrator Balls" issued on Mar. 6, 2007
3. U.S. Pat. No. 7,133,183 by Mario Rabinowitz, "Micro-Optics Solar Energy Concentrator" issued on Nov. 7, 2006.
4. U.S. Pat. No. 7,130,102 by Mario Rabinowitz, "Dynamic Reflection, Illumination, and Projection" issued on Oct. 31, 2006.
5. U.S. Pat. No. 7,115,881 by Mario Rabinowitz and Mark Davidson, "Positioning and Motion Control by Electrons, Ions, and Neutrals in Electric Fields" issued on Oct. 3, 2006.
6. U.S. Pat. No. 7,112,253, by Mario Rabinowitz, "Manufacturing Transparent Mirrored Mini-Balls for Solar Energy Concentration and Analogous Applications" issued on Sep. 26, 2006.
7. U.S. Pat. No. 7,077,361, by Mario Rabinowitz, "Micro-Optics Concentrator for Solar Power Satellites" issued on Jul. 18, 2006.
8. U.S. Pat. No. 6,988,809 by Mario Rabinowitz, "Advanced Micro-Optics Solar Energy Collection System" issued on Jan. 24, 2006.
9. U.S. Pat. No. 6,987,604 by Mario Rabinowitz and David Overhauser, "Manufacture of and Apparatus for Nearly Frictionless Operation of a Rotatable Array of Micro-Mirrors in a Solar Concentrator Sheet" issued on Jan. 17, 2006.
10. U.S. Pat. No. 6,975,445 by Mario Rabinowitz, "Dynamic Optical Switching Ensemble" issued on Dec. 13, 2005.
11. U.S. Pat. No. 6,964,486 by Mario Rabinowitz, "Alignment of Solar Concentrator Micro-Mirrors" issued on Nov. 15, 2005.
12. U.S. Pat. No. 6,957,894 by Mario Rabinowitz and Felipe Garcia, "Group Alignment Of Solar Concentrator Micro-Mirrors" issued on Oct. 25, 2005.
13. U.S. Pat. No. 6,843,573 by Mario Rabinowitz and Mark Davidson, "Mini-Optics Solar Energy Concentrator" issued on Jan. 18, 2005.
14. U.S. Pat. No. 6,738,176 by Mario Rabinowitz and Mark Davidson, "Dynamic Multi-Wavelength Switching Ensemble" issued on May 18, 2004.
15. U.S. Pat. No. 6,698,693 by Mark Davidson and Mario Rabinowitz, "Solar Propulsion Assist" issued on Mar. 2, 2004.
16. U.S. Pat. No. 6,612,705 by Mark Davidson and Mario Rabinowitz, "Mini-Optics Solar Energy Concentrator" issued on Sep. 2, 2003.
17. Solar Energy Journal, Vol. 77, Issue #1, 3-13 (2004) "Electronic film with embedded micro-mirrors for solar energy concentrator systems" by Mario Rabinowitz and Mark Davidson.

DEFINITIONS

"Adjustable Fresnel reflector" is a variable focusing planar reflecting surface much like a planar Fresnel lens is a focusing transmitting surface. Heuristically, it can somewhat be thought of as the projection of thin variable-angular segments of small portions of a thick focusing mirror upon a planar surface whose angles can be adjusted with respect to the planar surface.

"Concentrator" as used herein in general is an adjustable array of mirrors for focusing and reflecting light. In a solar energy context, it is that part of a Solar Collector system that directs and concentrates solar radiation onto a solar Receiver.

"Dielectric" refers to an insulating material in which an electric field can be sustained with a minimum power dissipation.

"Double Back-To-Back Mirrors" herein shall mean a pair of flat or slightly concave mirrors (in an array of such mirror pairs) that are joined together about a pivot axis so that when the top mirror becomes occluded, the pair can be rotated 180 degrees thus exposing the clean mirror for further usage.

"Electric dipole" refers to the polarization of negative and positive charge. This may be permanent as with electrets, or induced.

"Electric field" or "electric stress" refers to a voltage gradient. An electric field can produce a force on charged objects, as well as neutral objects. The force on neutral objects results from an interaction of the electric field on intrinsic or induced electric polar moments in the object.

"Electrical breakdown" occurs when a high enough voltage or electric field is applied to a dielectric (vacuum, gas, liquid, or solid) at which substantial electric charge is caused to move through the dielectric.

"Electret" refers to a solid dielectric possessing persistent electric polarization, by virtue of a long time constant for decay of charge separation.

"Enhanced or macroscopic electric field" is the electric field enhanced by whiskers very near the electrodes based upon the local (microscopic) geometry on the surface of the electrodes.

"Field emission or cold emission" is the release of electrons from the surface of a cathode (usually into vacuum) under the action of a high electrostatic field $\sim 10^7$ V/cm and higher. The high electric field sufficiently thins the potential energy barrier so that electrons can quantum mechanically tunnel through the barrier even though they do not have enough energy to go over the barrier. This is why it is also known as "cold emission" as the temperature of the emitter is not elevated.

"Focusing planar mirror" is a thin almost planar mirror constructed with stepped varying angles so as to have the optical properties of a much thicker concave (or convex) mirror. It can heuristically be thought of somewhat as the projection of thin equi-angular segments of small portions of a thick mirror upon a planar surface. It is a focusing planar reflecting surface much like a planar Fresnel lens is a focusing transmitting surface. If a shiny metal coating is placed on a Fresnel lens it can act as a Fresnel reflector.

"Gimbals are a two or more axis mount consisting of two or more rings mounted on axes at right angles to each other. An object mounted on a three ring gimbal can remain horizontally suspended on a plane between the rings regardless as to the stability of the base.

"Gimbal lock" occurs when two axes of rotation line up, depriving the availability of the other degree of freedom of rotation.

"Induced Electric dipole" refers to the polarization of negative and positive charge produced by the application of an electric field.

"Macroscopic electric field" is the applied electric field on the basis of the imposed voltage and the gross (macroscopic) geometry of the electrodes, and which is relevant as long as one is not too near the electrodes.

"Mean free path" of a particle is the average distance the particle travels between collisions in a medium. It is equal to [number density of the medium×collision cross-section]$^{-1}$.

"Optical elements" are the mirrors, reflectors, focusers, etc. of a concentrator array. As a focuser the optical element may be a lens or include a lens.

"Torr" is a unit of pressure, where atmospheric pressure of 14.7 lb/in$^2$=760 Torr=760 mm of Hg.

"Receiver" as used herein in general such as a solar cell or heat engine system for receiving reflected light. In a solar energy context, it receives concentrated solar radiation from the adjustable mirror assembly for the conversion of solar energy into more conveniently usable energy such as electricity.

SUMMARY OF THE INVENTION

Optical elements such as mirrors are normally made of a conductive metallic coating. In an applied electrostatic field, E, a dipole moment is induced in the metallic conducting material of pivoted-mirrors because the charge distributes itself so as to produce a field free region inside the conductor. To internally cancel the applied field E, free electrons move to the end of each conducting mirror antiparallel to the direction of E, leaving positive charge at the end that is parallel to the direction of E. Another way to think of this in equilibrium is that a good conductor cannot long support a voltage difference across it without a current source. An induced electrostatic dipole in a pivoted conductor in an electrostatic field is somewhat analogous to an induced magnetic dipole in a pivoted ferromagnetic material in a magnetic field, which effect most people have experienced. When pivoted, a high aspect ratio (length to diameter ratio) ferromagnetic material rotates to align itself parallel to an external magnetic field. It is clear that the same alignment technique can be done magnetically with an induced magnetic dipole in mirrors made of ferromagnetic material and/or an attached permanent dipole.

If double back-to-back mirrors are used, an option presents itself to use the better surface as the surface that reflects the light, and furthermore to have a standby mirror in each element should one of the mirrors degrade. A permanent electret dipole can be sandwiched between the two induced dipole mirrors to further enhance the dipole field that interacts with the addressable alignment fields.

It is relevant to consider the dipole interactions between mirrors. A heuristic analysis shows that this is not a serious problem. The electric field strength of a dipole, $E_d$ is proportional to $1/r^3$, where r is the radial distance from the center of the dipole. The energy in the field is proportional to $(E_d)^2$. Thus the energy of a dipole field varies as $1/r^6$. The force is proportional to the gradient of the field, and hence varies as $1/r^7$. With such a rapid fall off of the dipole interaction force, it can generally be made very small compared to the force due to the applied field E, and to the frictional forces that are normally present. Therefore interaction of the dipole field forces between mirrored elements (balls or cylinders) can generally be made negligible.

The instant invention can also operate by the induced dipole alignment of solar concentrator optical elements (mirrors) such that the dipole that is induced in the dielectric material surrounding a mirror acts in harmony with the induced dipole in each mirror. An external applied electric field E induces a dipole by polarizing the dielectric to partially cancel the field E inside the dielectric. As mentioned above, in an applied electrostatic field, E, a dipole moment is induced in the metallic conducting material of the pivoted-mirrors because the charge distributes itself so as to produce a field free region inside the conductor. To internally cancel the applied field E, free electrons move to the end of each conducting mirror antiparallel to the direction of E, leaving positive charge at the end that is parallel to the direction of E. The electrostatic field induces and aligns the electrostatic dipoles of the dielectric and mirrors in a way somewhat analogous to an induced magnetic dipole in a pivoted ferromagnetic material in a magnetic field. When pivoted, a high aspect ratio (length to thickness ratio) ferromagnetic material becomes polarized and rotates to align itself parallel to an external magnetic field. Similarly an electrostatic field polarizes and aligns each dielectric ball and mirror. The mirror has a high aspect ratio of diameter to thickness. Similarly the transparent dielectric part of the mirror has a high aspect ratio of diameter to thickness.

Although the primary application of the instant invention is for a solar concentrator application, there are a number of other applications such as mirrored illumination and projection, optical switching, solar propulsion assist, etc.

In the adjustable Fresnel reflectors solar concentrator with induced dipole alignment of pivoted mirrors that has been developed, the induced dipole aligns the optical elements to concentrate solar energy on a receiver having dimensions small compared to the dimensions of the array. This permits the focal point of the array to remain focused on the receiver over the course of a day and throughout the year.

Receivers, such as photovoltaic cells, convert the solar energy focused and delivered to them by the solar concentrator directly into electrical energy or via heat engines (e.g. Stirling cycle engines) which convert the solar energy into mechanical energy which can be used directly, or indirectly converted to electricity.

There are many aspects and applications of this invention, which provides techniques applicable individually or in combination as an actuator, for motion control, and for positioning of the optical elements of a solar concentrator and similar equipment. The broad general concept of this invention relates to the actuation, motion production and control, and positioning resulting from an induced dipole interaction of pivoted mirrors in electric fields by an electronic control grid. The instant invention can perform dynamic motion control over a wide range of dimensions from nanometers to centimeters, i.e. from the nano-range, through the micro-range, through the mini-range to the macro-range in a broad scope of applications in micro-electro-mechanical systems (MEMS) such as a solar concentrator, and in similar equipment such as optical switching to macro-positioning. Motorless linear motion, angular deflection, and continuous rotation are achieved without recourse to magnetic fields thus eliminating the need for coils. Furthermore, the instant invention permits less costly and greater ease of manufacture while providing well-defined motion and position control.

It is a general aspect of this invention to provide a dynamic system for motion control of an optical system.

Another general aspect of this invention to provide a positioning system of an optical system.

Another aspect of this invention to provide an actuator for an optical system.

Another aspect of this invention is to provide the motive force for an optical system.

Another aspect of the instant invention is to produce motorless motion of the elements of a solar concentrator.

Another aspect of this invention is to cause motorless angular deflection of the elements of a solar concentrator.

An aspect of the invention is to produce motorless continuous rotation of the elements of a solar concentrator.

An aspect of this invention is to produce motorless rotation with the ability to stop, of the elements of a solar concentrator.

Other aspects and advantages of the invention will be apparent in a description of specific embodiments thereof, given by way of example only, to enable one skilled in the art to readily practice the invention singly or in combination as described hereinafter with reference to the accompanying drawings. In the detailed drawings, like reference numerals indicate like components.

For small devices, when the grid gap is small or comparable to the electron mean free path in the ambient gas, then from an electrical breakdown point of view the pivoted mirrors operate effectively as if they were in vacuum. In this case operation at atmospheric pressure, is much the same as operation in vacuum. Air at standard temperature and 1 atmosphere pressure has a number density of molecules of $n \sim 3 \times 10^{19}$ molecules/cm³. The average spacing between molecules is $n^{-1/3} \sim 3 \times 10^{-7}$ cm = 30 Å. The mean free path of molecules is $\sim 10^{-5}$ cm = 1000 Å. The mean free path of electrons can be much higher than this.

GLOSSARY

The following is a glossary of components and structural members as referenced and employed in the instant invention with like reference alphanumerics indicating like components:

1—optical element (front side of mirror)
1—rotatable optical element (underside of mirror)
$\overline{2}$—edge of electret
3—negative-end of an electret dipole
4—positive-end of an electret dipole
5—electret dipole
5t—top of a grid compartment
5b—bottom of a grid compartment
6—edge of optical element (mirror)
7—gimbal pivots with 2 axes of rotation
8—support structure
9—universal pivot that can rotate or tilt in any direction
10—solar concentrator and receiver system
$\overline{12}$—solar concentrator assembly with enclosed array of pivoted mirrors
14—central axial shaft
16—support pillar
18—lubricating dielectric fluid
20—inclination angle adjustment device
22—rotation wheel
24—resistive grid wires
26—receiver (receives or collects light e.g. solar cell, Stirling cycle heat engine)
28—support rods
33—electronic control grid
$\overline{44}$—square electronic control grid (in perspective)
45—transparent sheet on top of grid
E—electric field
d—total dipole moment
V—voltage (number next to V indicates voltage location)
VS—voltage supply (may be used sequentially for cost reduction)
+—positive charge
−—negative charge

DETAILED DESCRIPTION OF THE PRESENTLY PREFERRED EMBODIMENTS

As is described here in detail, the objectives of the instant invention may be accomplished by any of a number of ways separately or in combination, as taught by the instant invention. A tracking solar concentrator has been developed in which the orientation of individual optical elements (mirrors, reflectors, lenses) is accomplished by electric dipole interaction between the electric field of a grid and an induced dipole, and/or an electret dipole, to align them consecutively or concurrently without the need for expensive, bulky, and heavy motors. Thus the improved solar concentrator of the instant invention can be less expensive, more reliable, and lighter in weight than conventional solar arrays.

Figure 1A:
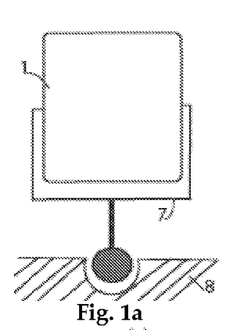
FIG. 1a is a front cross-sectional view of a gimbaled rectangular mirror that is one optical element of an adjustable Fresnel reflector solar concentrator.

FIG. 1a is a front cross-sectional view of a rectangular optical element (mirror) 1 supported by gimbals 7, which are mounted on a support 8. This is one member of an adjustable Fresnel reflector solar concentrator array. The mirror can be flat or slightly concave.

Figure 1B:
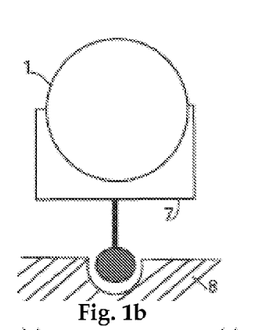
FIG. 1b is a front cross-sectional view of a gimbaled circular mirror that is one optical element of an adjustable Fresnel reflector solar concentrator.

FIG. 1b is a front cross-sectional view of a circular optical element (mirror) 1 supported by gimbals 7, which are mounted on a support 8. This is one member of an adjustable Fresnel reflector solar concentrator array. The mirror can be flat or slightly concave.

Figure 1C:
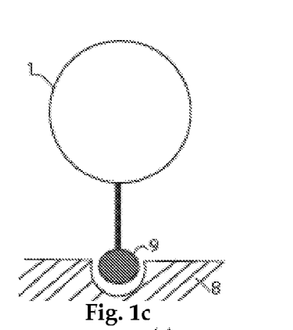
FIG. 1c is a front cross-sectional view of a circular mirror that is on a universal pivot, that is one optical element of an adjustable Fresnel reflector solar concentrator.

FIG. 1c is a front cross-sectional view of a circular optical element (mirror) 1 supported by a universal pivot 9 mounted on a support 8, that is one optical member of an adjustable Fresnel reflector solar concentrator. The mirror can be flat or slightly concave.

Figure 2A:
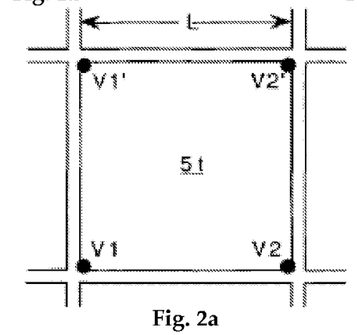
FIG. 2a is a schematic top view of an array of partitioned highly resistive electrodes showing in detail a top electrode of an electronic control grid for rotating the reflecting elements of a solar concentrator or other similar optical equipment. This schematic can represent either passive or active addressing as will be explained in the detailed description.

FIG. 2a represents a top view of an array of grid compartments with grid spacing L showing in detail a top view of one such top grid compartment 5t and the voltages at its four corners V1, V2, V1' and V2'. Voltages V1 and V2 correspond to voltages V1 and V2 shown in the cross sectional FIGS. 1a, and 1b. Voltages V1' and V2' are the voltages at the corners of this top of grid compartment 5t below the plane of the paper. Each grid electrode is made of a highly resistive thin transparent conductor.

Figure 2B:
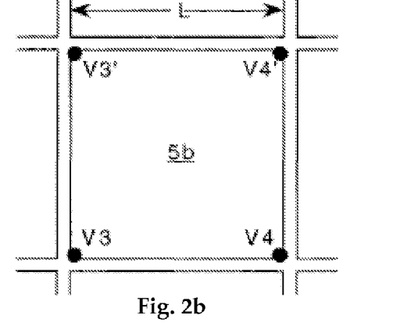
FIG. 2b represents a bottom view of an array of partitioned highly resistive electrodes showing in detail a view of a bottom electrode and the voltages at its four corners.

FIG. 2b represents a bottom view of an array of grid compartments delineated by highly resistive electrodes with grid spacing L showing in detail a view of a bottom electrode 5b and the voltages at its four corners V3, V4, V3' and V4'. Voltages V3 and V4 correspond to voltages V3 and V4 shown in the cross sectional FIGS. 1a and 1b. Voltages V3' and V4' are the voltages at the corners of this bottom electrode 5b below the plane of the paper.

Figure 2C:
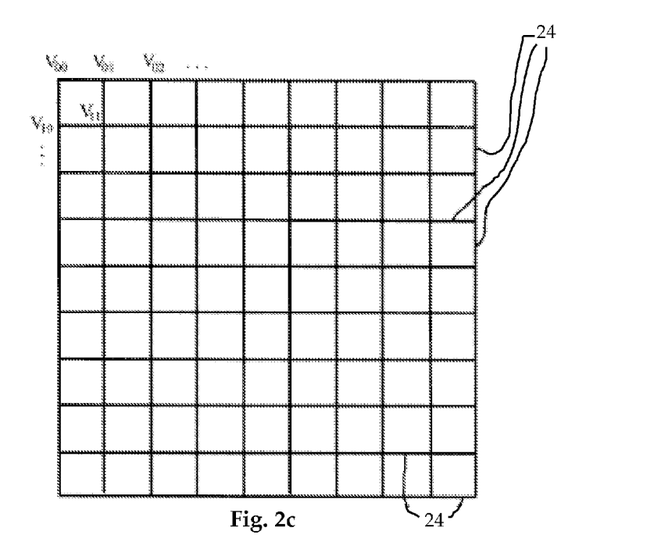
FIG. 2c is a schematic top view showing a generic electronic control grid that may represent a number of different kinds of transistorless grids; or grids with transistors at junctions, for matrix addressing and alignment of the optical elements of a solar concentrator or other similar optical equipment.

FIG. 2c is a schematic top view showing an electronic control grid 33 with resistive grid wires 24 for matrix addressing and alignment of the optical elements of a solar concentrator or other similar optical equipment. The term "equipment" is used in the instant invention to stand for Solar Energy Concentrators which may be of the Fresnel reflector type, or other types and equipment requiring addressing and alignment, such as optical switches and display equipment. This grid 33 can be laid on the bottom of the equipment, on the top and bottom of the equipment, on the top of the equipment with a ground plane on the bottom of the equipment, etc. In order to avoid having several similar looking figures, this schematic may be thought of as a representation of any one of several addressing grid arrays. It may be a wire grid array with one set of parallel wires on top of the equipment, separated and insulated from an orthogonal set of wires (that are parallel to each other) on the bottom of the equipment. It may be an actual interconnected grid with Thin Film Transistors (TFTs), tunneling junction transistors (as used in flash memories), or similar devices at each of the grid junctions. In this case it is preferable to use Polymer based transistors for flexibility. The grid 33 may be a segmented array with each square being a separate insulated slab (cf. to U.S. Pat. No. 6,964,486). In this case, the horizontal and vertical lines shown in FIG. 1 represent insulation between adjacent segments or slabs. The common element of all of these embodiments is the ability to impress the voltage $V_{ij}$ at the ij th node either statically or by means of a traveling wave. To minimize power dissipation, it is desirable to make the grid electrodes (edges) that delineate the grid compartments such as 5t and 5b of FIGS. 1 and 3 highly resistive so that a given voltage drop is accomplished with a minimum of current flow and hence with a minimum of power dissipation. The bus bars that bring the voltage to the grid electrodes may have a higher conductivity (lower resistance).

Figure 2D:
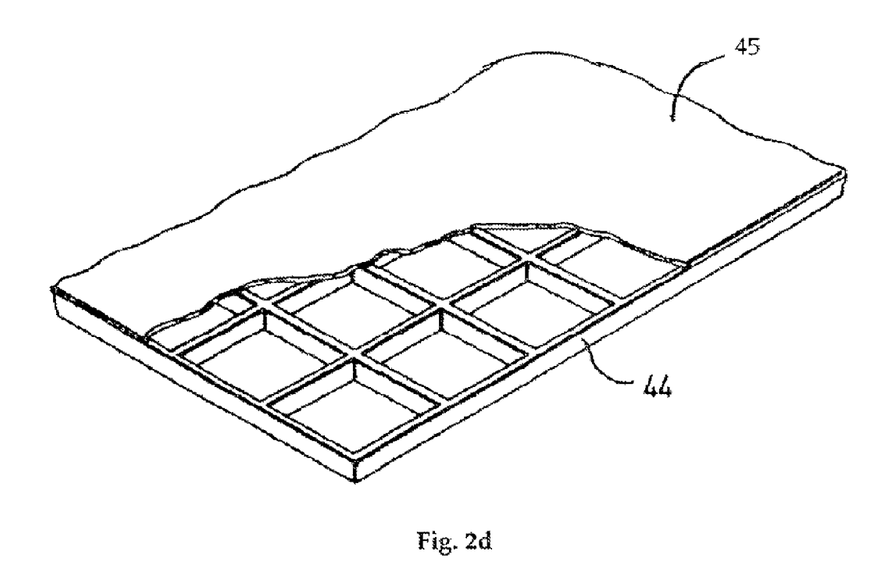
FIG. 2d is a cut-away perspective of a schematic control grid showing a transparent sheet on top of the grid.

FIG. 2d is a cut-away perspective of a schematic electronic control grid showing a transparent sheet 45 on top of the grid. The sheet 45 performs at least two functions. The sheet 45 protects the optical elements (mirrors) and permits an uninterrupted duty cycle of the concentrator, as the grimy, formerly fully transparent sheet can be cleaned, while the mirrors continue to perform their duty. If a fluid is used to increase the dielectric strength (breakdown voltage), the sheet 45 also functions to seal in the fluid.

Figure 3A:
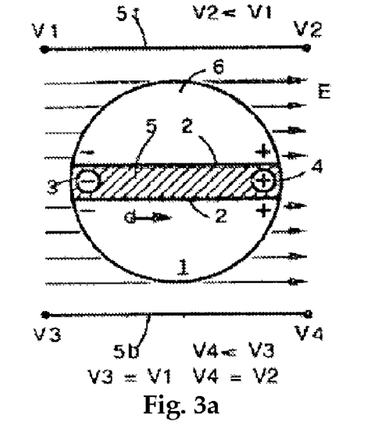
FIG. 3a is a bottom cross-sectional view of a rotatable element (circular mirror) with an electret dipole sandwiched between induced dipole mirrors aligned parallel to partitioned electrodes where an ensemble of such elements are a major constituent of a pivoted-optics concentrator.

FIG. 3a is a bottom cross-sectional view of a rotatable element (circular mirror) 1 in which a dipole d can be induced, and with an electret dipole 5, showing the dipole edge 2. The permanent electret dipole 5 can be sandwiched between the two induced dipole mirrors 1 to further enhance the dipole field that interacts with the addressable alignment fields. If double back-to-back mirrors are used, an option presents itself to use the better surface as the surface that reflects the light, and furthermore to have a standby mirror in each element should one of the mirrors degrade. In this case, the optical elements 1 can be a pair of mirrors (in an array of such mirror pairs), one or both of which are flat or slightly concave and joined together about a pivot axis so that when the top mirror becomes occluded, the pair can be rotated 180 degrees thus exposing the clean mirror for further usage.

Also shown is a top surface of a grid compartment 5t and bottom surface of a grid compartment 5b, where an ensemble of such elements and electrodes are a major constituent of a pivoted-optics concentrator. The mirror edge 6 is shown near the top surface of a grid compartment 5t. The grid compartment is delineated by the grid electrodes (cf. FIGS. 2a and 2b). U.S. Pat. No. 6,964,486 by Mario Rabinowitz, "Alignment of Solar Concentrator Micro-Mirrors" issued on Nov. 15, 2005; and U.S. Pat. No. 7,187,490 by Mario Rabinowitz, "Induced Dipole Alignment Of Solar Concentrator Balls" issued on Mar. 6, 2007 describe induced dipole coupling of mirrors and grid for purposes of tracking and focusing alignment.

A processor sends signals via bus bars to establish voltages from a power supply to each corner of a grid compartment (cf. FIGS. 2a and 2b) whose edges are grid electrodes made of a highly resistive thin conductor. At the top of the grid compartment 5t, the left corner is at voltage V1 and the right corner is at voltage V2. For the bottom of grid compartment 5b, the left corner is at voltage V3 and the right corner is at voltage V4 as shown. If a signal sets the voltages so that V3=V1, V4=V2, V2<V1, and V4<V3, this produces an approximately uniform applied electric field E parallel to the grid compartment faces 5t and 5b as shown.

The applied electric field E induces a dipole moment in the metallic conducting material of the mirrors 2. This is because when a metallic conductor is placed in an electric field, the charge distributes itself so as to produce a field free region inside the conductor. To internally cancel the applied field E, negative − free electrons move to the end of each conducting mirror 2 opposite to the direction of E, leaving positive + charge at the end in the direction of E. The torque interaction of the induced electric dipole moment of the mirrors 2 and the electric field E acts to align the mirrors 2 parallel to the electric field E as shown here in FIG. 1. The torque is proportional to the product of E and the dipole moment.

An electret 5 can be used to augment the torque. In equilibrium i.e. when the rotation is complete, the polarization due to the electret 5 and that due to the induced charges of the conducting mirrors 1 add together to produce a total dipole moment d parallel to the mirrors 1, and parallel to the applied electric field E. The positive + end 4 and the negative − end 3 of the electret 5 align themselves parallel to the electric field E due to the torque interaction of the permanent electric dipole moment of the electret 5 and the applied electric field E, which is proportional to their product. Since the electret 5 and its dipole moment are parallel to the mirrors 1, this torque interaction aligns the mirrors 1 parallel to the applied electric field E.

The presence of the optional electret 5, enhances the torque. In the absence of the electret 5, the dipole moment induced in the mirrors 1 can be sufficient to produce alignment. However, the additional torque provided by the electret 5 helps to overcome frictional effects.

Figure 3B:
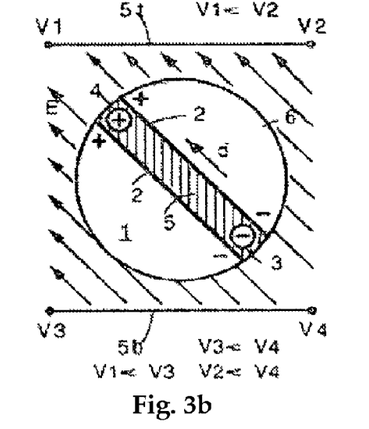
FIG. 3b is a bottom cross-sectional view of a rotatable element (circular mirror) with an electret dipole sandwiched between induced dipole mirrors aligned at a tilted angle with respect to partitioned electrodes where an ensemble of such elements are a major constituent of a pivoted-optics concentrator.

FIG. 3b is a bottom cross-sectional view of a rotatable element (circular mirror) with an electret dipole sandwiched between induced dipole mirrors aligned at a tilted angle with respect to partitioned electrodes where an ensemble of such elements are a major constituent of a pivoted-optics concentrator. Shown is a bottom cross-sectional view of a rotatable element 1 (circular mirror) with an optional electret dipole 5 aligned at a tilted angle with respect to the top of a grid compartment 5t and the bottom of a grid compartment 5b, where an ensemble of such elements and electrodes are a major constituent of a pivoted-optics concentrator. For the top of grid compartment St, the left corner is at voltage V1 and the right corner is at voltage V2. For the bottom of a grid compartment 5b, the left corner is at voltage V3 and the right corner is at voltage V4. A signal sets the voltages so that V1<V2, V3<V4, V1<V3, and V2<V4, producing an approximately uniform applied electric field E that is tilted with respect to the electrodes 5t and 5b as shown. The mirrors 1 align themselves parallel to the electric field E due to the induced dipole field polarization of the mirrors, and permanent dipole of the electret 5. Two-axis tracking is possible by additional alignment of the mirrors 1 out of the plane of the paper. This is accomplished by similar voltage relationships to those already described as can be understood from the top and bottom electrode views shown in FIGS. 2a and 2b.

Figure 4A:
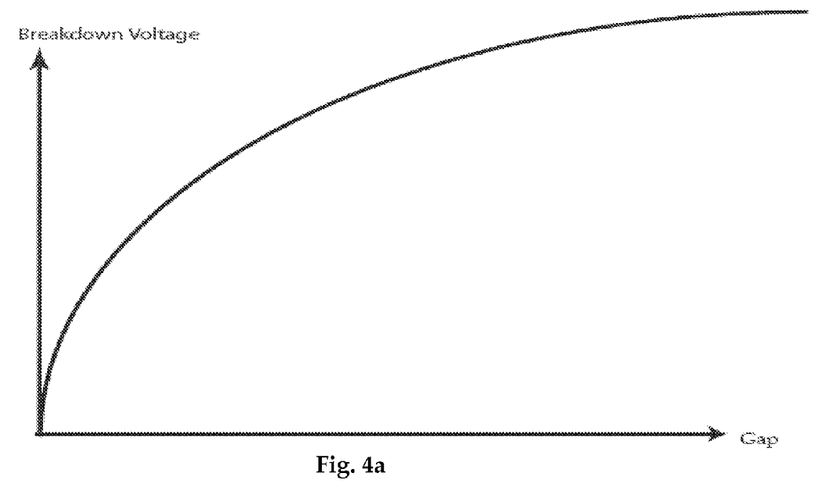
FIG. 4a is a generic graph of breakdown voltage as a function of electrode gap that applies to vacuum and a wide variety of fluids in a uniform electric field.

FIG. 4a is a generic graph of breakdown voltage as a function of electrode gap that applies to vacuum and a wide variety of fluids in a uniform electric field. The breakdown voltage increases rapidly with increasing gap at small gaps. This translates into a much larger electric field breakdown strength at small gaps than at large gaps as shown in FIG. 4b.

Figure 4B:
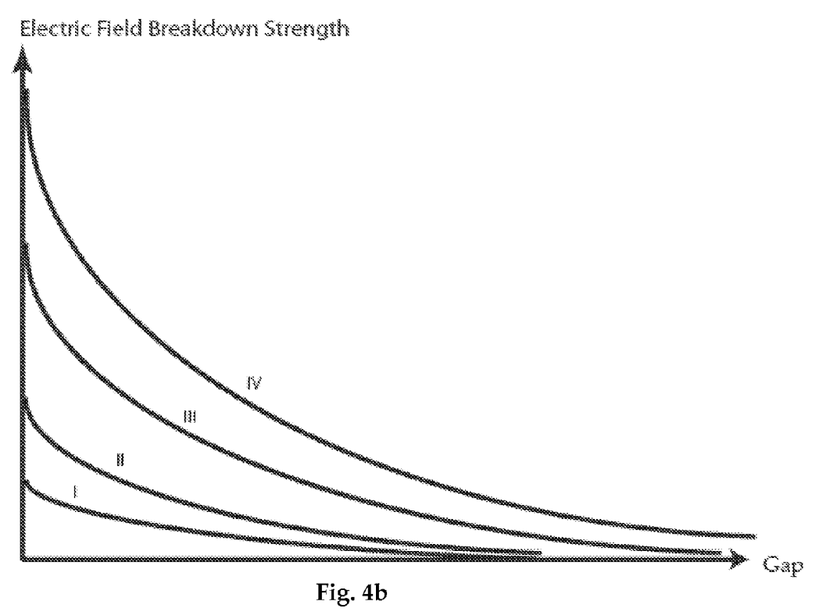
FIG. 4b is a generic graph of uniform electric field breakdown strength in which the dielectric strength of vacuum and other fluids are compared.

FIG. 4b is a generic graph of uniform electric field breakdown strength in which the dielectric strength of vacuum, and other fluids are compared. This is a semi-log graph in which the electric field breakdown strength varying between 0 and 3 MV/cm is plotted linearly on the vertical axis. The gap is plotted logarithmically on the horizontal axis, varying from 0.01 cm to 10 cm. In this range vacuum has the highest dielectric strength, as depicted by Curve IV. Herein we consider a preferable vacuum to be a pressure of $<10^{-5}$ Torr ($<1.3 \times 10^{-3}$ Pascal), though pressures as high as $10^{-3}$ Torr may also work for some purposes. At a gap of 0.01 cm, the dielectric strength of vacuum can be as high as ~3 MV/cm. At 1 cm, the dielectric strength of vacuum falls to ~$10^5$ V/cm.

Air at atmospheric pressure is depicted by Curve I. Air at atmospheric pressure has an electrical breakdown field of $E_{bkn}$~$10^5$ V/inch=$4 \times 10^4$ V/cm for a gap ~$10^{-1}$ cm; and for a gap ~$10^{-3}$ cm=$10^5$ Å=$10^{-5}$ m, $E_{bkn}$ is considerably higher. For comparison, in vacuum ($<10^{-5}$ Torr=$1.3 \times 10^{-3}$ Pascal) $E_{bkn}$~$2 \times 10^5$ V/inch=$8 \times 10^4$ V/cm for d~$10^{-1}$ cm; and for d~$10^{-3}$ cm=$10^5$ Å=$10^{-5}$ m, $E_{bkn}$ is considerably higher.

Curve II represents the breakdown field of air at ~10 atmospheres pressure at ambient temperature. This is ~10 times the density of ordinary air. With the exception of vacuum, the breakdown field of most media is proportional to density. This is illustrated by Curve III which represents the breakdown field of oils or liquids like carbon tetrachloride ($CCl_4$). For a comprehensive discussion of breakdown strengths in different media, and the nature of electrical breakdown refer to *McGraw-Hill Encyclopedia of Science & Technology*, article on Electrical Insulation by Mario Rabinowitz in any of the editions from 1982-20002.

Figure 5:
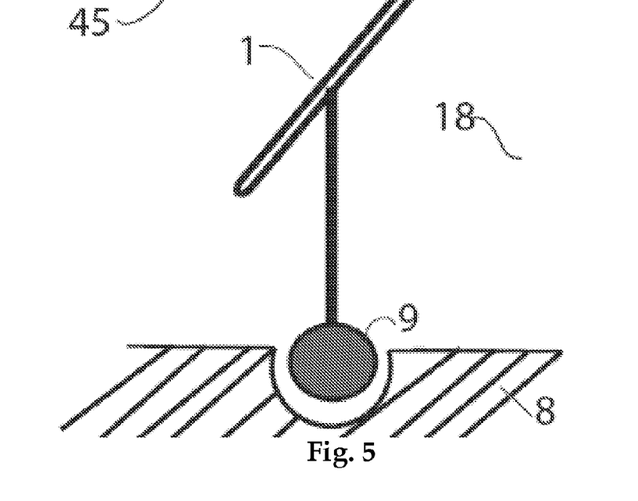
FIG. 5 is a side profile view of a rotatable element (mirror) immersed in a fluid and supported by a universal pivot.

FIG. 5 is a side profile view of a rotatable mirror 1, supported by a universal pivot 9 which is mounted on a support 8, all of which are immersed in a contained fluid 18 and covered by a transparent sheet 45. The array of such mirrors can be in air without the covering protection of a transparent sheet 45. However as previously discussed the covering protection of a transparent sheet 45 is preferable as is the fluid (or vacuum). The fluid 18 serves as lubricant and corrosion resistant medium. The fluid 18 is also preferable to increase the dielectric strength, and as such a contained fluid with high dielectric strength and low dielectric constant is preferable.

Figure 6:
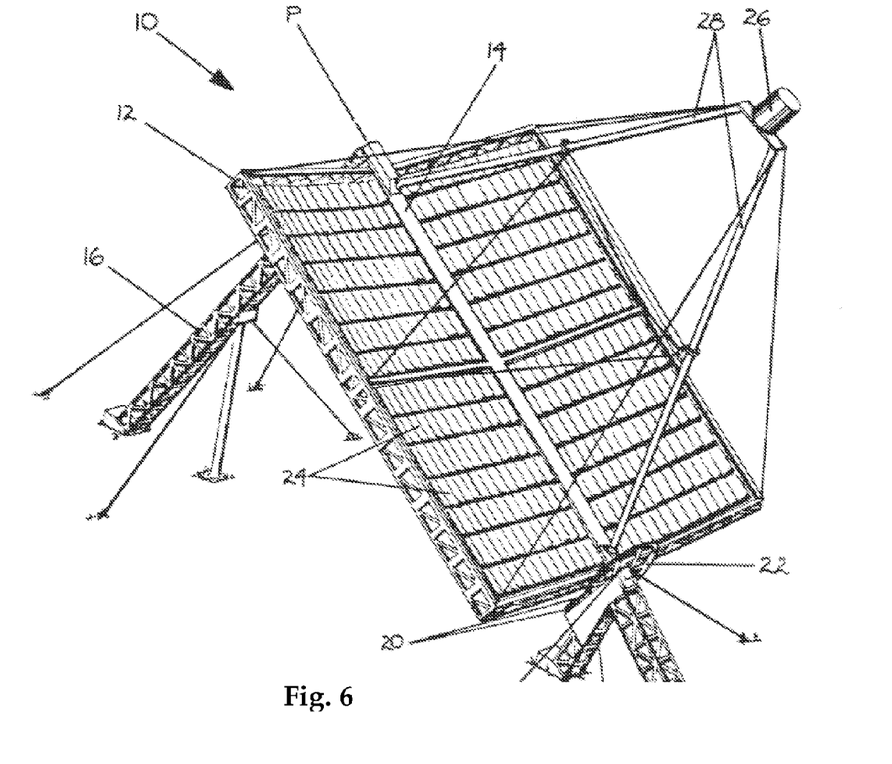
FIG. 6 is a perspective illustration of a solar concentrator array that tracks the sun and focuses sunlight onto a receiver.

FIG. 6 is a perspective illustration of a presently preferred embodiment of a solar concentrator and receiver system 10 that tracks the sun and focuses sunlight onto a receiver $\overline{26}$ which is held by support rods 28 and guy wires (shown as fine lines). The support structure includes a support pillar 16, and an inclination angle adjustment device 20. The solar concentrator assembly 12 is comprised of an array of enclosed optical elements that are supported on an inclined central shaft 14 which can rotate around a rotation pin P that operates in conjunction with a rotation wheel 22. The optical elements 1 and $\underline{1}$ are the pivoted mirrors, reflectors, focusers, etc. of a concentrator array that were depicted and described in conjunction with FIGS. 1a, 1b, 1c, 3a, 3b, and 5. As a focuser an optical element may be a lens or include a lens.

The inclination angle of the support frame 18 can be adjusted to accommodate geographic location such as latitude, and/or inclination of the surface upon which it is mounted such as the ground or a rooftop. The desired inclination is to be oriented toward the sun to minimize the needed angular alignment in terms of attitude and azimuth. Ideally, the concentrator array 12 surrounds the receiver 26 with the optical elements (mirrors) being individually adjusted by means of induced dipole and permanent dipole (electret) interaction with the electric field of the control grid to maximize the amount of energy flux (solar power) reflected to the receiver 26 on a daily and on an annual basis. The array (assembly) of dynamic optical elements can provide a Fresnel reflective paraboloidal surface by means of the resistive grid wires 24. An optimizing sensor such as a photomultiplier may be mounted on the receiver 26 to maximize the reflected light from each element of the array 12 as is described in conjunction with FIG. 7, or alternatively this may be done with the receiver itself.

Figure 7:
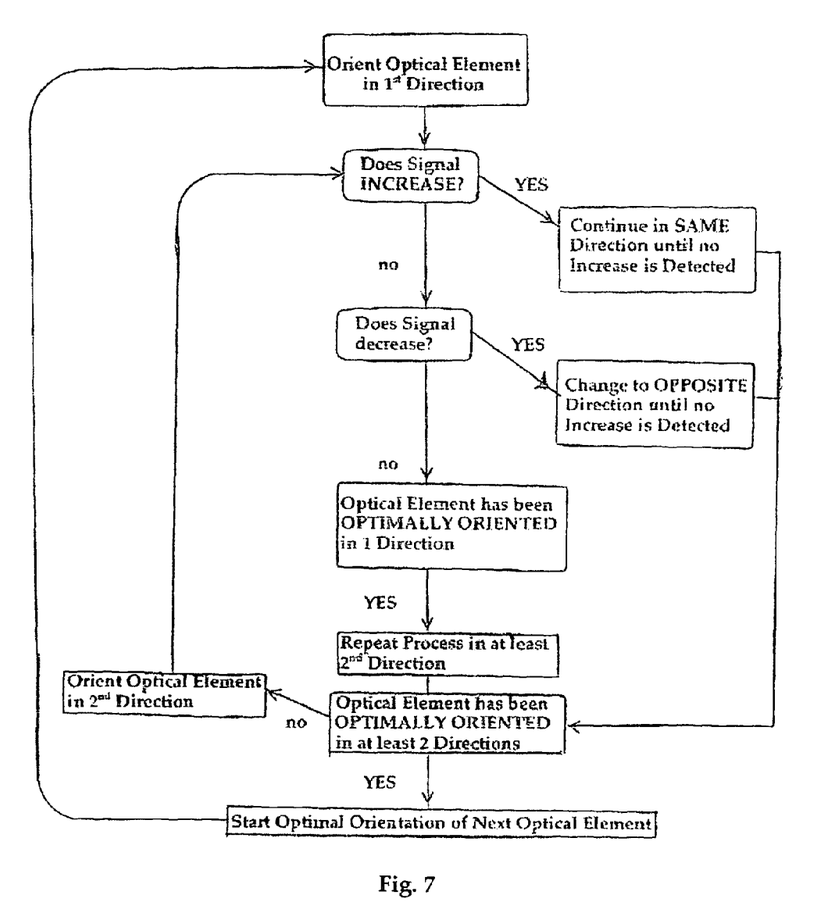
FIG. 7 is a block diagram flow chart summarizing a method in which a positive feedback system can optimize the tracking and focusing of the solar concentrator array.

FIG. 7 is a block diagram flow chart summarizing a method in which a positive feedback loop can optimize the tracking and focusing of the solar concentrator array 4. As discussed in U.S. Pat. No. 6,988,809 (Rabinowitz, Jan. 24, 2006), an approximate alignment (orientation) calibration may be done at the factory using GPS (Global Positioning Satellite) input related to the final placement site and orientation, with in-situ fine tuning at the installation location. Positive feedback optimization can only work when there is an initial signal to guide the feedback process by means of a digital processor.

Preferably with the sun overhead on a clear day, the orientation of the elements (mirrors) 1 can be adjusted to maximize the power output of the receiver 26. For example an optimizing sensor such as a photomultiplier can be attached to the receiver 26, and used to increase sensitivity to the reflected light signal by means of positive feedback. On cloudy days, the optimizing sensor or just the receiver 26 can be used to find that orientation of the elements 1 that maximizes the receiver 26 output. This orientation may be away from the sun, and point toward the most reflective cloud. The elements 1 may be individually oriented, or groups of elements 1 may be collectively oriented to simplify tracking and focusing. When groups are collectively oriented, as a group they may have a projected group concavity to aid in the focusing to the receiver 26.

An optimizing sensor can direct the steps shown in the block diagram flow chart of FIG. 7. A given element 1 is actuated by dipole interaction with the control grid to adjust the alignment of the selected optical element 1 in a first angular direction. If the signal from the optimizing sensor (photomultiplier) increases in response to the change, the element (mirror) 1 is again adjusted in the same angular direction. This process is continued until a slight decrease is perceived. Then the element 1 is adjusted in the opposite direction, increasing the signal back to its prior value. Now smaller steps are taken back and forth until a maximum signal is obtained. This process is then repeated in a additional angular directions until the alignment of an element 1 is optimized. This process is then continued element by element until all the elements are optimized in their alignment. Computer readable memory stores the location of each element 1. Alternatively, groups of elements 1 can be similarly optimized in their alignment as a whole.

DISCUSSION

Now that the instant invention has been described and the reader has a reasonable understanding of it, we can more clearly discuss its advantages with respect to other possible concentrator alignment mechanisms.

1. One of the most important advantages of the invention is related to ease of calibration, and response speed in producing a given desired motion or deflection by means of the preferred induced and/or permanent electric dipole interaction with the electric fields of the control grid, although a completely analogous magnetic interaction can also be used. For the same applied force, electromagnetic systems are inherently slower in responding to an input signal because of self-inductance and mutual-inductance effects. Magnetic systems are inherently slower because of the time the magnetic field takes to diffuse into a conducting medium after it is applied. Furthermore, it would be unwieldy to put motors on each element (mirror) of an array.

To have only one or a few motors accomplish alignment of an array by mechanical coupling means such as long rods and turnbuckles, would be a slow, cumbersome, and painstaking process. In a cloudless sky, speed of alignment may not be critical for a solar concentrator, due to the slowly changing position of the sun relative to the earth. However with fast moving clouds, speed can be a decisive factor.

2. The power requirements to produce a given desired alignment by means of an induced and/or permanent electric dipole interaction with the electric fields of the control grid mechanisms of the instant invention are moderate. The power consumption is small in comparison with electromagnetic motors.

3. Electromagnets in general and electromagnetic motors in particular become quite inefficient as they are scaled down to the mini or micro size range. The present invention is more amenable to miniaturization such as required in nanotechnology.

SCOPE OF THE INVENTION

While the instant invention has been described with reference to presently preferred and other embodiments, the descriptions are illustrative of the invention and are not to be construed as limiting the invention. Thus, various modifications and applications may occur to those skilled in the art without departing from the true spirit and scope of the invention as summarized by the appended claims together with their full range of equivalents. It is to be understood that in said claims, ingredients recited in the singular are intended to include compatible combinations of such ingredients wherever the sense permits. It should be recognized that the methods and apparatus of this invention can be used in other contexts than those explicitly described herein. It is also to be understood that the following claims are intended to cover all of the generic and specific features of the invention herein described, and all statements of the scope of the invention which, as a matter of language, might be said to fall there between.

The invention claimed is:

1. A solar concentrator system comprising
   a) a solar concentrator array of adjustable planar mirrors;
   b) each of said planar mirrors mounted on an externally attached pivot point;
   c) wherein each of said pivot points is attached above the mirror, attached to the side of the mirror, or attached below the mirror;
   d) said mirrors immersed in an electrically insulating fluid with electric field breakdown strength greater than $10^3$ V/cm;
   e) said mirrors coupled to an electronic control grid;
   f) said control grid activated by a digital processor;
   g) dipole linkage to rotate said mirrors; and
   h) a receiver for energy conversion of concentrated light.

2. The apparatus of claim 1, wherein said fluid is transparent to visible light.

3. The apparatus of claim 1, wherein said fluid consists of at least one of the group of vacuum at less than $10^{-3}$ Torr, oil, and carbon tetrachloride ($CCl_4$).

4. The apparatus of claim 1, wherein said fluid is a gas at an elevated pressure greater than atmospheric.

5. The apparatus of claim 1, wherein said mirrors are covered by a transparent sheet.

6. The apparatus of claim 1, wherein said dipole consists of at least one of an induced dipole and a permanent dipole.

* * * * *